United States Patent
Hack et al.

(10) Patent No.: US 12,341,466 B2
(45) Date of Patent: **\*Jun. 24, 2025**

(54) INTEGRATED PHOTOVOLTAIC WINDOW AND LIGHT SOURCE

(71) Applicant: Universal Display Corporation, Ewing, NJ (US)

(72) Inventors: Michael Hack, Carmel, CA (US); Stephen R. Forrest, Ann Arbor, MI (US)

(73) Assignee: Universal Display Corporation, Ewing, NJ (US)

( * ) Notice: Subject to any disclaimer, the term of this patent is extended or adjusted under 35 U.S.C. 154(b) by 102 days.

This patent is subject to a terminal disclaimer.

(21) Appl. No.: 17/838,318

(22) Filed: Jun. 13, 2022

(65) Prior Publication Data

US 2022/0311375 A1    Sep. 29, 2022

Related U.S. Application Data

(62) Division of application No. 17/215,400, filed on Mar. 29, 2021, now Pat. No. 11,837,989, which is a (Continued)

(51) Int. Cl.
*H02S 20/26* (2014.01)
*G09G 3/3208* (2016.01)
(Continued)

(52) U.S. Cl.
CPC .......... *H02S 20/26* (2014.12); *H10F 19/807* (2025.01); *G09G 3/3208* (2013.01); *H02J 7/35* (2013.01);
(Continued)

(58) Field of Classification Search
CPC ..... H02S 20/26; H01L 31/0488; H01L 31/12; H10F 19/807
See application file for complete search history.

(56) References Cited

U.S. PATENT DOCUMENTS

| 4,769,292 | A | 9/1988 | Tang |
| 5,247,190 | A | 9/1993 | Friend |

(Continued)

FOREIGN PATENT DOCUMENTS

| CN | 201533260 U | 7/2010 |
| CN | 204920702 U | 12/2015 |

(Continued)

OTHER PUBLICATIONS

Baldo et al. "Highly efficient phosphorescent emission from organic electroluminescent devices", Nature, vol. 395, pp. 151-154, 1998.

(Continued)

*Primary Examiner* — Lindsey A Buck
(74) *Attorney, Agent, or Firm* — Butzel Long

(57) ABSTRACT

Implementations of the disclosed subject matter provide a window, an energy and light producing device including at least one transparent photovoltaic device and at least one non-transparent Organic Light Emitting Device (OLED) in an optical path of the window. A controller may control the operation of the non-transparent OLED of the energy and light producing device. An energy storage device may be electrically coupled to the controller and the energy and light producing device to store energy generated by the transparent photovoltaic device and to power the non-transparent OLED. In some implementations, a LED or OLED may be mounted in the frame of the window and may be powered by the energy storage device.

20 Claims, 7 Drawing Sheets

Related U.S. Application Data division of application No. 16/221,736, filed on Dec. 17, 2018, now Pat. No. 10,992,252.

(60) Provisional application No. 62/607,374, filed on Dec. 19, 2017.

(51) Int. Cl.
| | |
|---|---|
| *H02J 7/35* | (2006.01) |
| *H10F 19/80* | (2025.01) |
| *H10F 55/00* | (2025.01) |
| *H10K 30/81* | (2023.01) |
| *H10K 50/805* | (2023.01) |
| *H10K 59/60* | (2023.01) |
| *H10K 59/80* | (2023.01) |

(52) U.S. Cl.
CPC .............. *H10F 55/00* (2025.01); *H10K 30/81* (2023.02); *H10K 50/805* (2023.02); *H10K 59/60* (2023.02); *H10K 59/805* (2023.02)

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 8,950,886 B2 | 2/2015 | Meng |
| 9,728,735 B2 | 8/2017 | Bulovic |
| 10,992,252 B2 * | 4/2021 | Hack ................. H01L 31/0488 |
| 2003/0230980 A1 | 12/2003 | Forrest |
| 2004/0174116 A1 | 9/2004 | Lu |
| 2005/0105303 A1 * | 5/2005 | Emde ................. B32B 17/10045 362/616 |
| 2010/0065834 A1 * | 3/2010 | Hammond ............ H10K 39/10 977/734 |
| 2012/0120643 A1 * | 5/2012 | Meng ................. H10K 19/201 362/183 |
| 2012/0241731 A1 * | 9/2012 | Ban ...................... F21S 9/037 257/E51.012 |
| 2013/0329404 A1 | 12/2013 | Larkin |
| 2015/0108508 A1 | 4/2015 | Wu |
| 2017/0229663 A1 | 8/2017 | Tsai |

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

English machine translation of CN201533260U. (Year: 2015).
English machine translation of CN 204920702 U. (Year: 2015).

\* cited by examiner

US 12,341,466 B2

INTEGRATED PHOTOVOLTAIC WINDOW AND LIGHT SOURCE

CROSS-REFERENCE TO RELATED APPLICATIONS

This application is a divisional of U.S. patent application Ser. No. 17/215,400, filed Mar. 29, 2021, which is a divisional of U.S. patent application Ser. No. 16/221,736, filed Dec. 17, 2018, which claims priority to U.S. Patent Application Ser. No. 62/607,374, filed Dec. 19, 2017, the entire contents of each are incorporated herein by reference.

FIELD

The present invention relates to an integrated window and light source that includes a transparent photovoltaic, a light emitting device (LED) or organic light emitting device (OLED), a controller, and a battery.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an implementation of the disclosed subject matter, an organic light emitting diode/device (OLED) is also provided. The OLED can include an anode, a cathode, and an organic layer, disposed between the anode and the cathode. According to an implementation of the disclosed subject matter, the organic light emitting device is incorporated into one or more device selected from a consumer product, an electronic component module, a lighting panel, photovoltaic device, and/or smart window.

According to an implementation of the disclosed subject matter, a device is provided that may include a window comprising a transparent or translucent glass pane. The device may include an energy and light producing device including at least one transparent photovoltaic device and at least one non-transparent Organic Light Emitting Device (OLED), in an optical path of the window, and the at least one non-transparent OLED outputs light. A controller may control the operation of the at least one non-transparent OLED of the energy and light producing device. An energy storage device may be electrically coupled to the controller and the energy and light producing device to store energy generated by the at least one transparent photovoltaic device and to power the at least one non-transparent OLED of the energy and light producing device. The at least one transparent photovoltaic device and the at least one non-transparent OLED of the energy and light producing device may have a common electrode. One of the at least one transparent photovoltaic device and the at least one non-transparent OLED of the energy and light producing device may be laminated onto the glass pane. One of the at least one transparent photovoltaic device and the at least one non-transparent OLED of the energy and light producing device may be disposed on the glass pane. One of the at least one transparent photovoltaic device and the at least one non-transparent OLED of the energy and light producing device may be on separate transparent substrates in the optical path of the window. The at least one transparent photovoltaic device of the energy and light producing device may have a conversion efficiency greater than 10% and a transparency greater than 30% across the visible spectrum. The device provides greater than 10,000 lumens per $m^2$ of window area for at least one half the time the device is exposed to sunlight. A portion of the light emitted by the at least one non-transparent OLED of the energy and light producing device may be reflected to provide indirect lighting of an environment.

According to an implementation of the disclosed subject matter, a device is provided that may include a window comprising a transparent or translucent glass pane, and a frame that surrounds the glass pane. At least one transparent photovoltaic device may be disposed in the optical path of the window. At least one Light Emitting Device (LED) or Organic Light Emitting Device (OLED) may be disposed in the frame to output light. A controller may control the operation of the at least one LED or OLED. An energy storage device that is electrically coupled to the controller, the at least one transparent photovoltaic device, and the at least one LED or OLED to store energy generated by the transparent photovoltaic device and to power the at least one LED or OLED. The device may include a transparent light guide disposed on the at least one LED or OLED. The at least one LED or OLED may output light to illuminate at least a portion of the transparent light guide to provide non-glare illumination. The at least one transparent photovoltaic device may be laminated onto the glass pane. The at least one transparent photovoltaic device may be disposed on the glass pane. The at least one transparent photovoltaic device may have a conversion efficiency greater than 10% and a transparency greater than 30% across the visible spectrum. The device may provide greater than 10,000 lumens per $m^2$ of window area for at least one half the time the device is exposed to sunlight. A portion of the light emitted by the at least one LED or OLED may be reflected to provide indirect lighting of an environment.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
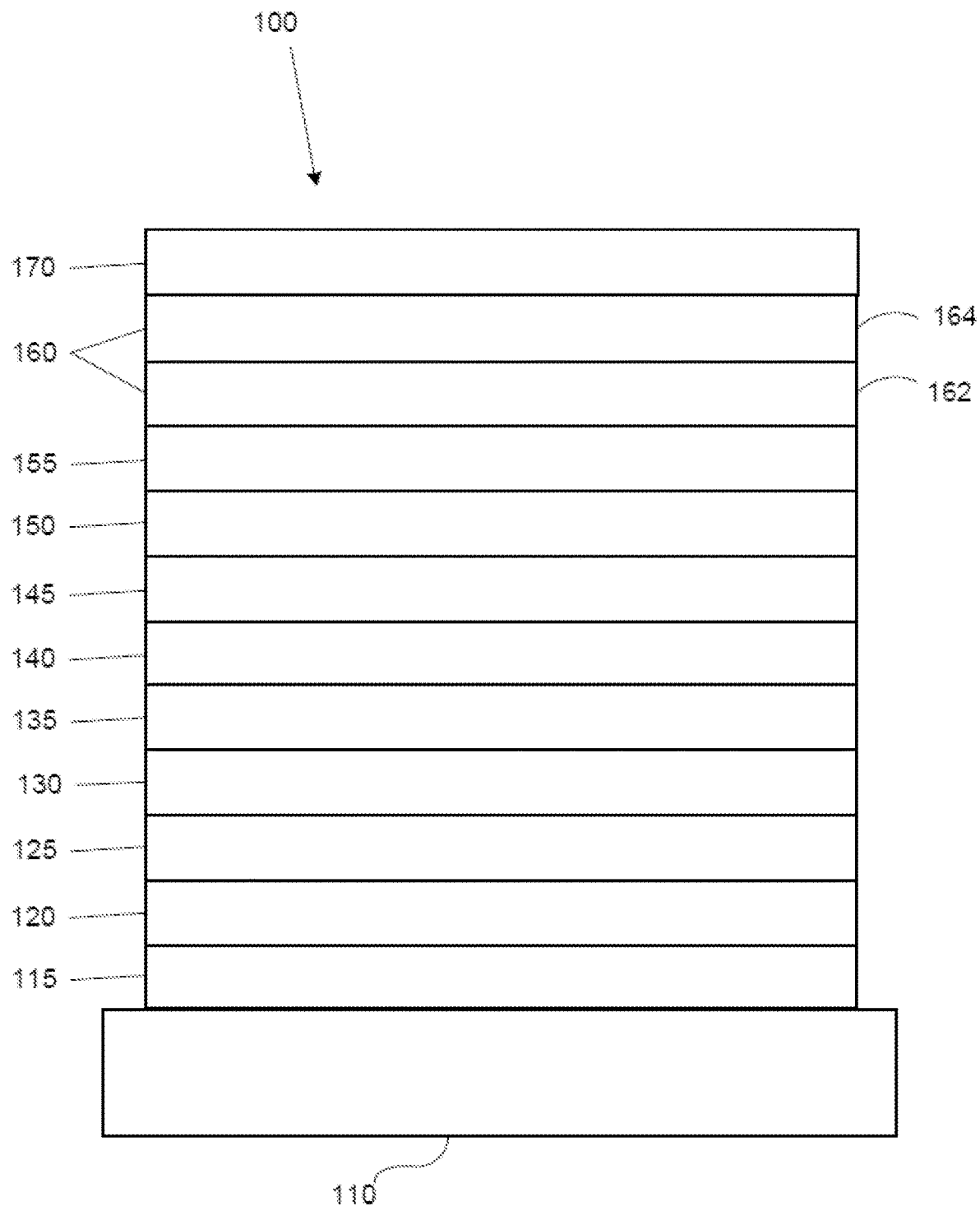
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
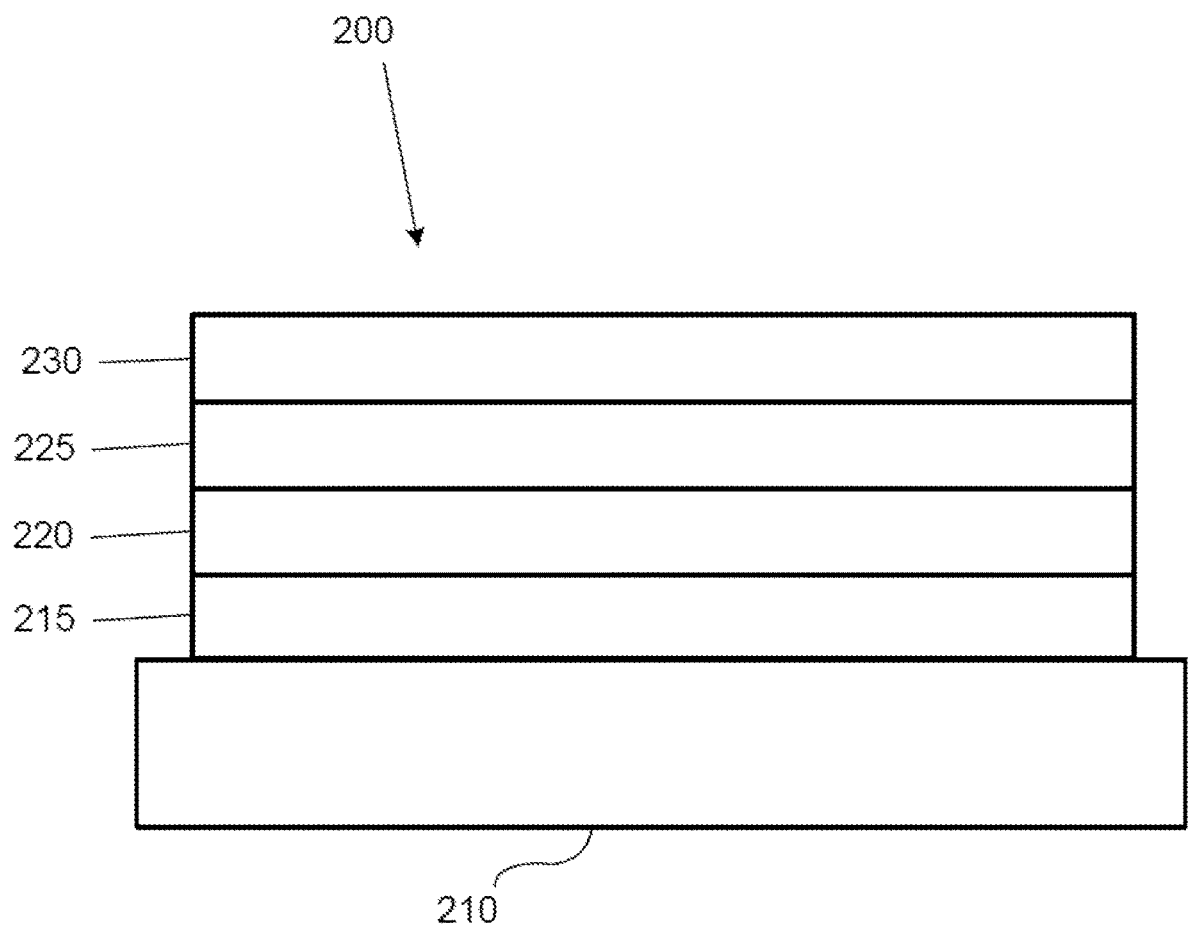
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

An organic photovoltaic (OPV) cell may be a type of photovoltaic device that uses organic materials, such as conductive organic polymers or small organic molecules for light absorption and charge transport to produce electricity from sunlight by the photovoltaic effect. Organic photovoltaic cells may be polymer solar cells. Changing the length and functional group of polymers may change the band gap, allowing for electronic tunability. The optical absorption coefficient of organic molecules is high, so a large amount of light can be absorbed with a small amount of materials, usually on the order of hundreds of nanometers.

The organic photovoltaic cell may convert light into direct current (DC) electricity. Depending on the band gap of the light-absorbing material, photovoltaic cells can also convert low-energy, infrared (IR) or high-energy, ultraviolet (UV) photons into DC electricity. A common characteristic of both the small molecules and polymers used as the light-absorbing material in photovoltaics is that they have large conjugated systems. A conjugated system may be formed where carbon atoms covalently bond with alternating single and double bonds. These hydrocarbons' electrons pz orbitals delocalize and form a delocalized bonding π orbital with a π* antibonding orbital. The delocalized π orbital is the highest occupied molecular orbital (HOMO), and the π* orbital is the lowest unoccupied molecular orbital (LUMO). In organic semiconductor physics, the HOMO takes the role of the valence band while the LUMO serves as the conduction band. The energy separation between the HOMO and LUMO energy levels is considered the band gap of organic electronic materials and is typically in the range of 1-4 eV.

All light with energy greater than the band gap of the material may be absorbed. There may be a trade-off to reducing the band gap as photons absorbed with energies higher than the band gap will thermally give off its excess energy, resulting in lower voltages and power conversion efficiencies. When these materials absorb a photon, an excited state may be created and confined to a molecule or a region of a polymer chain. The excited state may be regarded as an exciton, or an electron-hole pair bound together by electrostatic interactions. In photovoltaic cells, excitons may be broken up into free electron-hole pairs by effective fields. The effective fields are set up by creating a heterojunction between two dissimilar materials. In organic photovoltaics, effective fields may break up excitons by causing the electron to fall from the conduction band of the absorber to the conduction band of the acceptor molecule. It is necessary that the acceptor material has a conduction band edge that is lower than that of the absorber material. If the organic material is visible in the optical portion of the solar spectrum, and absorbs photons in the infra-red or ultraviolet, then the OPV devices can be transparent or semi-transparent allowing them to be used in windows.

Organic photovoltaic cells that include polymers may have an electron- or hole-blocking layer on top of an indium tin oxide (ITO) conductive glass followed by electron donor and an electron acceptor (in the case of bulk heterojunction cells), a hole or electron blocking layer, and metal electrode on top. The composition and order of the blocking layers, as well as the composition of the metal electrode, may depend on whether the cell follows a regular or an inverted device architecture. In an inverted cell, the electric charges may exit the device in the opposite direction as in a normal device because the positive and negative electrodes are reversed.

In bulk heterojunction polymer OPV cells, light may generate excitons. Subsequent charge separation in the interface between an electron donor and acceptor may blend within the device's active layer. These charges may transport to the device's electrodes where the charges flow outside the cell, perform work, and then re-enter the device on the opposite side. Hole mobility may provide increased conduction across the active layer.

Organic photovoltaics may be made of electron donor and electron acceptor materials, rather than semiconductor p-n junctions. The molecules forming the electron donor region of organic PV cells, where exciton electron-hole pairs are generated, may be generally conjugated polymers possessing delocalized π electrons that result from carbon p orbital hybridization. These πE electrons can be excited by light in or near the visible part of the spectrum from the molecule's highest occupied molecular orbital (HOMO) to the lowest unoccupied molecular orbital (LUMO), denoted by a π-π* transition. The energy bandgap between these orbitals may determine which wavelength(s) of light can be absorbed.

Unlike in an inorganic crystalline PV cell material, with its band structure and delocalized electrons, excitons in organic photovoltaics may be strongly bound with an energy between 0.1 and 1.4 eV. This strong binding occurs because electronic wave functions in organic molecules are more localized, and electrostatic attraction can thus keep the electron and hole together as an exciton. The electron and hole may be dissociated by providing an interface across which the chemical potential of electrons decreases. The material that absorbs the photon is the donor, and the material acquiring the electron is called the acceptor. For example, a polymer chain may be the donor, and fullerene may be the acceptor. Even after dissociation, the electron and hole may still be joined as a "geminate pair", and an electric field may be used to separate them. The electron and hole may be collected at contacts. If charge carrier mobility is insufficient, the carriers may not reach the contacts, and instead recombine at trap sites or remain in the device as undesirable space charges that oppose the flow of new carriers. The latter problem may occur if electron and hole mobilities are not matched. In that case, space-charge limited photocurrent (SCLP) hampers device performance.

Organic photovoltaics may be fabricated with an active polymer and a fullerene-based electron acceptor. Illumination of this system by visible light may provide electron transfer from the polymer to a fullerene molecule.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products and/or other products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Other products having the OLEDs disclosed herein may include windows, smart windows, energy producing devices, energy efficient building materials, energy efficient lighting, and the like. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Transparent and Non-Transparent OLEDs

Transparent and non-transparent OLEDs may be formed, based on the selection of anode and cathode materials. For example, metals may be selected for the anode and cathode, so as to provide non-transparent contacts. In contrast, transparent OLEDs may be formed by selecting transparent conductive oxides to be used for the anode and cathode, and the substrate is also typically transparent. The transparent OLEDs may emit light from both sides, whereas non-transparent OLEDs may only emit light from one surface. In the implementations of the disclosed subject matter, non-transparent OLEDs may be selected to be disposed in the optical path of a window to output light. This arrangement of non-transparent OLEDs provides light that is output from one side of the OLED to light an environment, such as a room, in which the window is mounted. That is, non-transparent OLEDs may more efficiently output light to illuminate a desired environment in comparison to a transparent OLED, in that the transparent OLEDs output a portion of light to an undesired environment, such as outside of a room in which the window is mounted.

In implementations of the disclosed subject matter, photovoltaic devices may be integrated into buildings to provide net zero energy consumption structures and to meet LEED (Leadership in Energy and Environmental Design) certifications. For example, transparent photovoltaic devices may be integrated into windows of buildings, as windows often represent a large surface area of the total outside surface area of buildings. However, connecting windows having photovoltaic devices to an electrical grid is typically expensive. Local wiring, inverters, and the like generally do not exist in portions of buildings where windows are installed.

To save energy and provide illumination for buildings, implementations of the disclosed subject matter provide a self-contained and/or self-powered integrated window with lighting that includes an energy storage device. Photovoltaic devices disposed in the optical path of the window may generate energy that is stored in the energy storage device, and may be used to power lights integrated within the window and/or window frame. Such a structure may provide lighting at night, while providing natural daylight during the daytime.

In implementations of the disclosed subject matter, a window that includes photovoltaic devices and illumination sources may generate as much light as a current fluorescent troffer (i.e., fluorescent light fixture) for at least 3 hours per day without requiring any external power source. A 1 $m^2$ panel of photovoltaic devices may yield 300 W hours operating at 10% PCE (power conversion efficiency) for 5 hours sun per day and downgraded 40% for being in a window. To produce 10,000 $lm/m^2$ (i.e., same as a typical fluorescent fixture) at 100 lm/W is 100 W. That is, a panel of photovoltaics disposed in an optical path of a window may generate energy to power a light source integrated with the window for 3 hours (300 W of energy produce may output 10,000 $lm/m^2$ at 100 $W/m^2$ per hour for 3 hours).

Implementations of the disclosed subject matter may dispose nontransparent OLEDs in the optical path of the window, and/or may dispose LEDs and/or OLEDS in the frame of the window to provide illumination. In some implementations, the operation of the LEDs and/or OLEDS may be controlled, via a controller. In some implementations, the LEDs and/or OLEDs may be wirelessly controlled via a mobile phone, smart watch, computing device, and/or other suitable wireless controller. In some implementations, the light output from the LEDs and/or OLEDs may be color tunable via a wired and/or wireless controller. In some implementations, the one or more sensors may be included, for example, on the window frame and/or within a room that the widows are mounted. The sensors may determine the amount and/or color of light output by the LEDs and/or OLEDs, and a controller may adjust the power and/or color of the light output by one or more of the LEDs and/or OLEDs so that it is the same and or similar for each window in a predetermined area.

Implementations of the disclosed subject matter may provide glare reduction. If the light sources of the window are producing 10,000 $lm/m^2$, and the light sources are disposed in the window frame (e.g., where the window frame border is 10 cm), the luminance may be 100,000 $lm/m^2$ for a 1 $m^2$ window. That is, such a window may produce glare that exceeds a predetermined amount. To reduce this glare, some of the generated light may be reflected back towards the window. For example, if the window that includes lighting is being used as a skylight, a portion of the light may be reflected back towards the ceiling to produce indirect illumination into a room. In some implementations, a transparent light guide may be disposed over the LEDs and/or OLEDs in the frame of the window so as to provide non-glare illumination to the user. In some implementations, LEDs and/or OLEDs may be aligned and/or controlled to output light away from a user so as to reduce glare. In some implementations, window light may be directed upwards towards ceiling and downwards towards floor to reduce glare. In this implementation, LED and/or OLED lighting may be disposed in the top and bottom sides of the window frame, or along one or more edge surfaces of the window frame (e.g., left and/or right sides of the window frame).

In some implementations, one or more photovoltaic devices (e.g., organic photovoltaic cells) may be fabricated and/or deposited directly onto window, or may be laminated onto the window glass. One or more photovoltaic devices and OLEDs (e.g., non-transparent OLEDs) may be integrated and disposed in the optical plane of a window. The OLEDs may provide area lighting, which is different than edge-positioned LEDs and OLEDs that may be mounted to the frame of the window. A common electrode may be used for both the photovoltaic devices and OLEDs to simply construction and reduce costs.

Implementations of the disclosed subject matter may provide a self-contained illumination assembly with no external power connections, that may include photovoltaic device (e.g., a transparent organic photovoltaic device) to generate electricity with a power conversion efficiency greater than 10%, a transparency greater than 30% across the visible spectrum, a light source, an energy storage device (e.g., battery), and a controller to control the operation of the slight source. The device may provide greater than 10,000 lumens per $m^2$ of area for at least half the time the assembly is exposed to bright sunlight.

In some implementations, light sources (e.g., non-transparent OLEDs) may not overlap an active area of the photovoltaic device (e.g., a transparent organic photovoltaic device). The window and/or window frame may include a light guide such that it is edge lit to enable whole area of the window to emit light. A portion of the generated light may be reflected back towards the surface containing the window to reduce glare.

Figure 3:
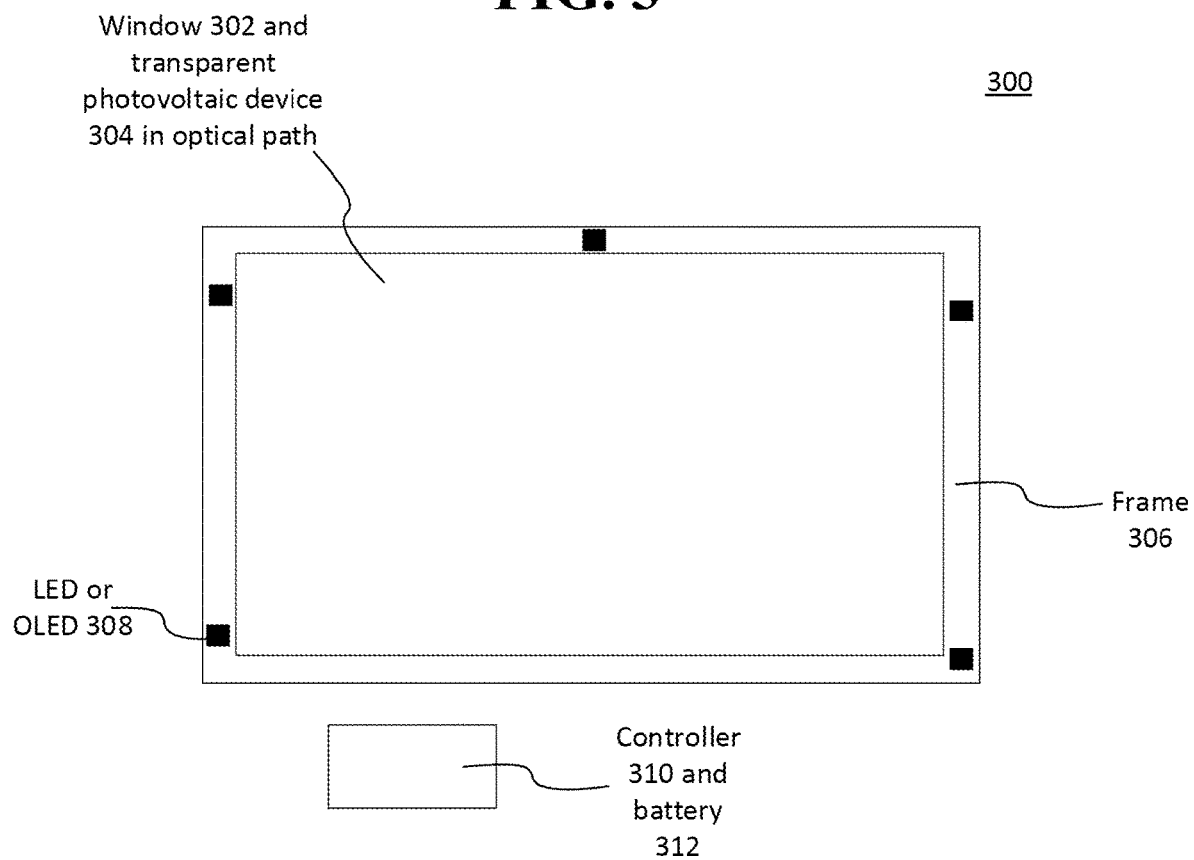
FIG. 3 shows a window having a transparent photovoltaic device in an optical path of the window and a LED or OLED disposed in the frame of the window according to an implementation of the disclosed subject matter.

FIG. 3 shows a device 300 including a window having a transparent photovoltaic device in the optical path of the window and a LED or OLED disposed in the frame of the window according to an implementation of the disclosed subject matter. The device 300 may include a window 302 having a transparent or translucent glass pane, and a frame 306 that surrounds the glass pane. The device 300 may include at least one transparent photovoltaic device 304 in the optical path of the window 302. At least one Light Emitting Device (LED) 308 or Organic Light Emitting Device (OLED) 308 may be disposed in the frame 306 to output light. A controller 310 may control the operation of the at least one LED 308 or OLED 308. An energy storage device 312 may be electrically coupled to the controller 310, the at least one transparent photovoltaic device 304, and the at least one LED 308 or OLED 308 to store energy generated by the transparent photovoltaic device 304 and to power the at least one LED 308 or OLED 308. The energy storage device 312 may be a battery or any suitable device to store energy.

In some implementations, the device 300 may include a transparent light guide disposed on the at least one LED 308 or OLED 308, which may output light to illuminate at least a portion of the transparent light guide to provide reduced glare or non-glare illumination.

The at least one transparent photovoltaic device 304 of the device 300 may have a conversion efficiency greater than 10% and a transparency of at least 30% across the visible spectrum (e.g., 400 nm to 700 nm). More generally, as disclosed herein, a "transparent" device may have a transparency of at least 30%, more preferably 50%, more preferably 60%, more preferably 70%, or the like across the visible spectrum. The device 300 may provide greater than 10,000 lumens per $m^2$ of window area for at least one half the time the device 300 is exposed to sunlight. A portion of the light emitted by the at least one LED 308 or OLED 308 may be reflected to provide indirect lighting of an environment. Indirect lighting may be light output from the at least one LED 308 or OLED 308 that is reflected off one or more surfaces of an environment (e.g., a ceiling and/or walls of a room) to provide lighting, rather than direct illumination of the environment by the at least one LED 308 or OLED 308 without reflection.

The window 302, including the transparent photovoltaic device 304, may have a transparency of at least 25% across the visible spectrum (e.g., 400 nm to 700 nm). As disclosed herein, the window 302 may have a transparency of at least 25%, more preferably 50%, more preferably 60%, more preferably 70%, or the like across the visible spectrum.

Figure 4:
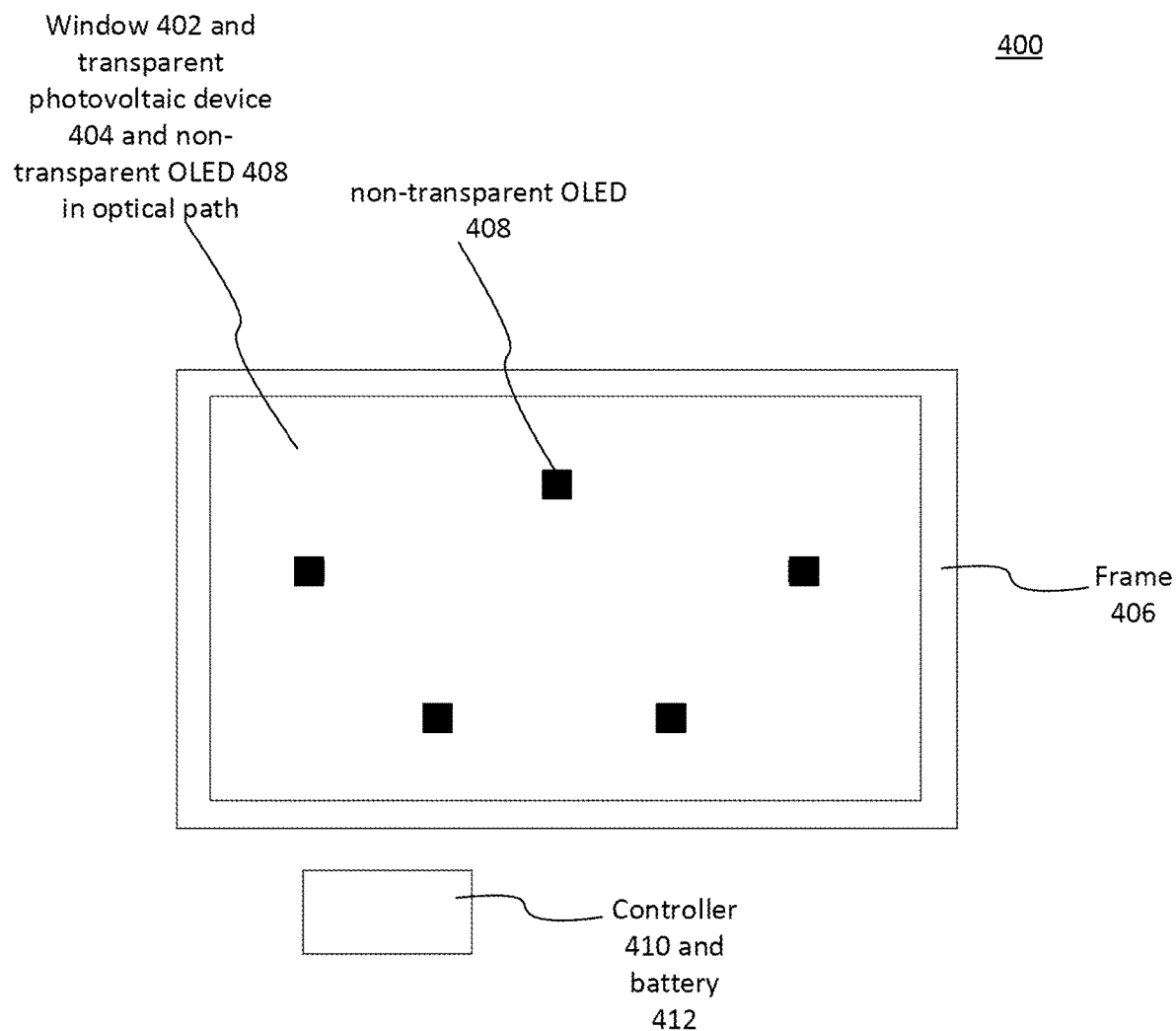
FIG. 4 shows a window having a transparent photovoltaic device and a non-transparent OLED in the optical path of the window according to an implementation of the disclosed subject matter.

FIG. 4 shows a device 400 including window having a transparent photovoltaic device and a non-transparent OLED in the optical path of the window according to an implementation of the disclosed subject matter. The device 400 includes a window 402 having a transparent or translucent glass pane surrounded by a frame 406. An energy and light producing device may include at least one transparent photovoltaic device 404 and/or at least one non-transparent Organic Light Emitting Device (OLED) 408, in an optical path of the window 402, and the at least one non-transparent OLED 408 outputs light. As used throughout, a transparent device may be transparent for more than 20% over the visible spectrum (e.g., 400 nm-700 nm). The non-transparent OLED 408 may be less than 20% transparent over the visible spectrum.

A controller 410 may control the operation of the at least one non-transparent OLED 408 of the energy and light producing device. An energy storage device 412 may be electrically coupled to the controller 410 and the energy and light producing device to store energy generated by the at least one transparent photovoltaic device 404 and to power the at least one non-transparent OLED 408 of the energy and light producing device.

In some implementations, the at least one transparent photovoltaic device 404 and the at least one non-transparent OLED 408 of the energy and light producing device may have a common electrode.

In some implementations, the at least one transparent photovoltaic device 404 of the energy and light producing device may have a conversion efficiency greater than 10% and a transparency greater than 30% across the visible spectrum (e.g., 400 nm to 700 nm). The device 400 may provide greater than 10,000 lumens per $m^2$ of area of window 402 for at least one half the time the device 400 is exposed to sunlight.

In some implementations, a portion of the light emitted by the at least one non-transparent OLED 408 of the energy and light producing device may be reflected to provide indirect lighting of an environment. Indirect lighting may be light output from the at least one non-transparent OLED 408 that is reflected off one or more surfaces of an environment (e.g., a ceiling and/or walls of a room) to provide lighting, rather than direct illumination of the environment by the at least one non-transparent OLED 408.

Figure 5A:
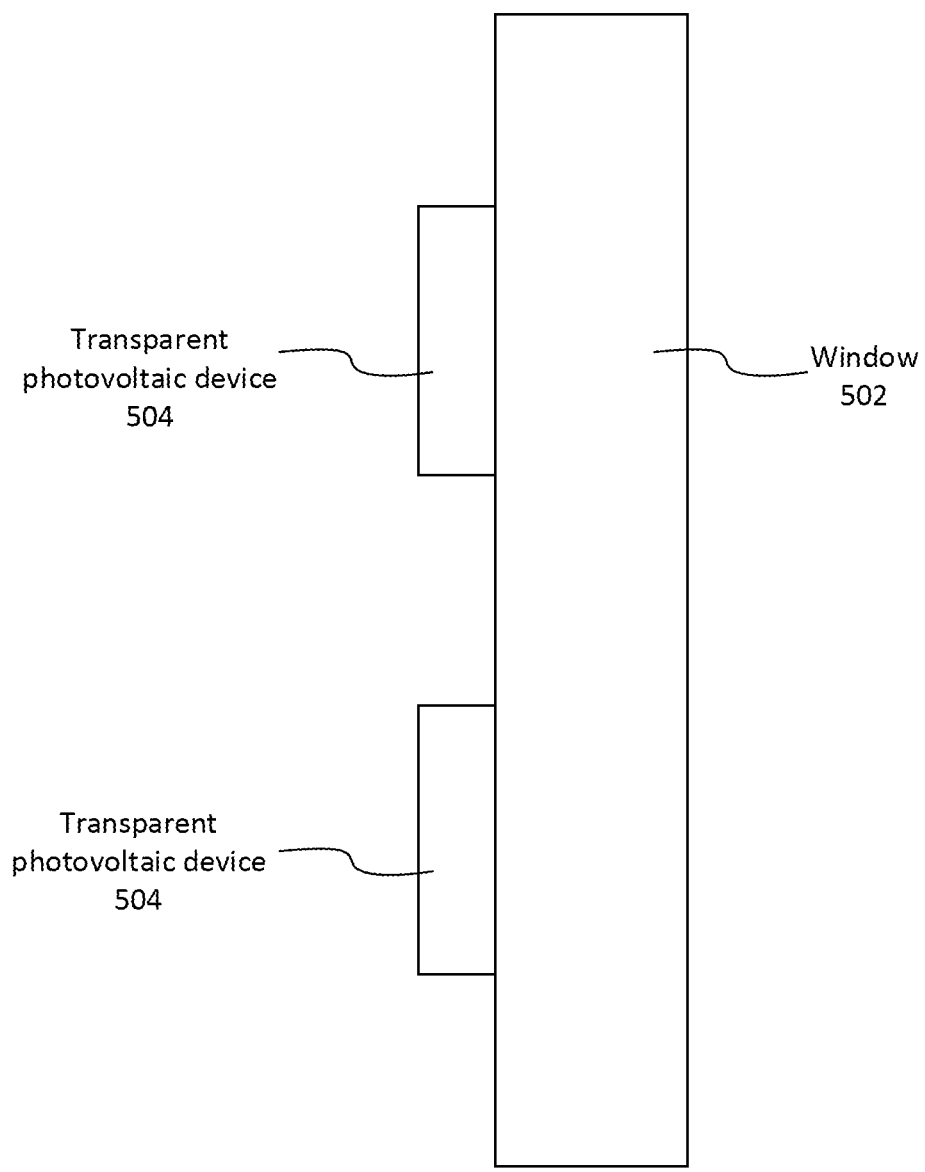
FIG. 5A shows a side view of the window having a transparent photovoltaic device laminated or disposed on a glass pane of the window according to an implementation of the disclosed subject matter.

FIG. 5A shows a side view of a device 500a including a window having a transparent photovoltaic device laminated or disposed on a glass pane of the window according to an implementation of the disclosed subject matter. At least one transparent photovoltaic device 504 may be laminated onto and/or disposed on the glass pane of the window 502. The at least one transparent photovoltaic device 504 may be similar or the same as the at least one transparent photovoltaic device 304, 404 shown in FIGS. 3-4 and described above.

Figure 5B:
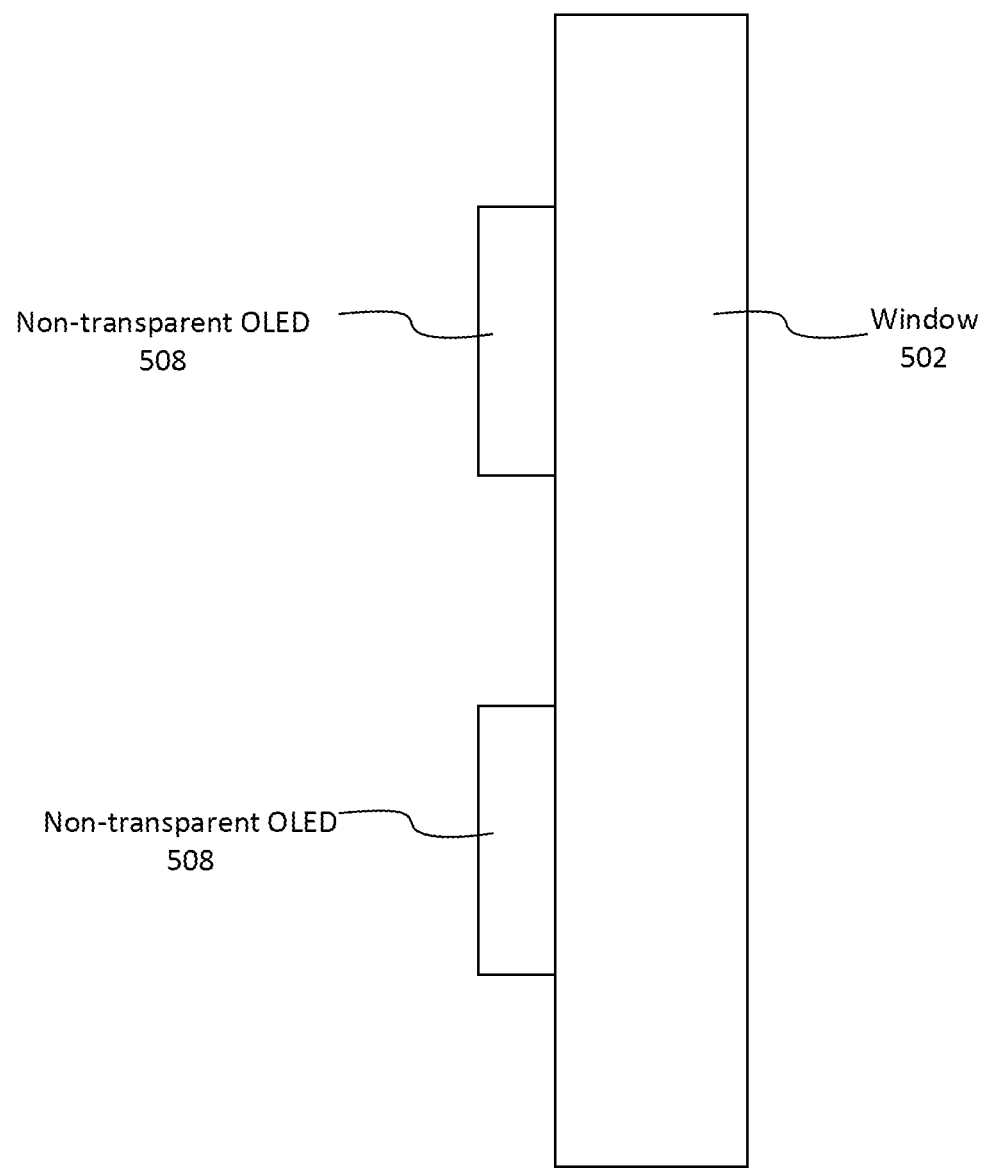
FIG. 5B shows a side view of the window having a non-transparent OLED laminated or disposed on a glass pane of the window according to an implementation of the disclosed subject matter.

FIG. 5B shows a side view of a device 500b including a window having a non-transparent OLED laminated or disposed on a glass pane of the window according to an implementation of the disclosed subject matter. At least one non-transparent OLED 508 may be laminated onto and/or disposed on the glass pane of the window 502. The at least one non-transparent OLED 508 may be similar or the same as the OLED 308 and/or the non-transparent OLED 408 shown in FIGS. 3-4 and described above.

Figure 6:
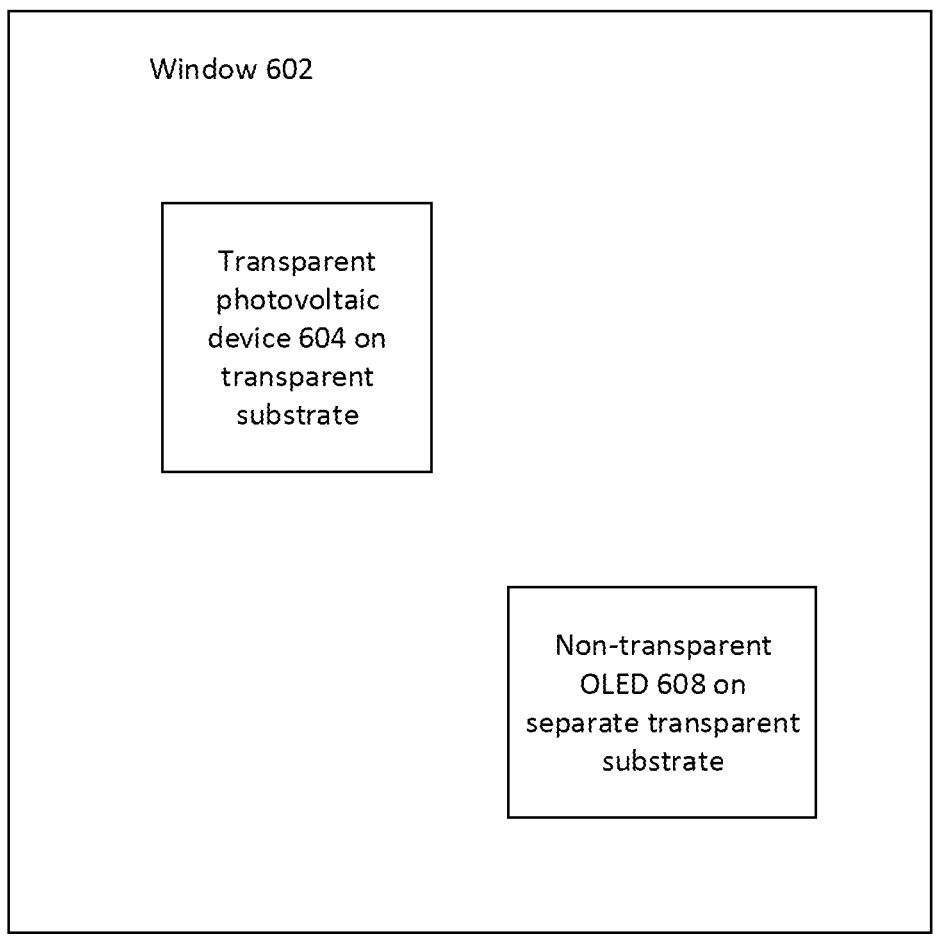
FIG. 6 shows a window where a transparent photovoltaic device and/or a non-transparent OLED are disposed on separate substrate in the optical path of the window according to an implementation of the disclosed subject matter.

FIG. 6 shows a device 600 including a window where a transparent photovoltaic device and/or a non-transparent OLED are disposed on separate substrate in the optical path of the window according to an implementation of the disclosed subject matter. One of the at least one transparent photovoltaic device 604 and the at least one non-transparent OLED 608 of the energy and light producing device are on separate transparent substrates in the optical path of a window 602.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
a window comprising a transparent or translucent glass pane;
an energy and light producing device including at least one transparent photovoltaic device disposed on a first substrate in a first area of an optical path of the glass pane of the window, and at least one non-transparent Organic Light Emitting Device (OLED) disposed on a second substrate that is disposed in a second area of the optical path of the glass pane of the window, wherein the first substrate and the second substrate are separate transparent substrates and the second substrate is smaller than the first substrate and the glass pane, wherein the at least one transparent photovoltaic device fully overlaps the at least one non-transparent OLED, and wherein the at least one non-transparent OLED outputs light;
a controller to control the operation of the at least one non-transparent OLED of the energy and light producing device; and
an energy storage device that is electrically coupled to the controller and the energy and light producing device to store energy generated by the at least one transparent photovoltaic device and to power the at least one non-transparent OLED of the energy and light producing device.

2. The device of claim 1, wherein the first active area of the at least one transparent photovoltaic device and the second active area of the at least one non-transparent OLED are offset from one another.

3. The device of claim 1, wherein the at least one transparent photovoltaic device and the at least one non-transparent OLED of the energy and light producing device have a common electrode.

4. The device of claim 1, wherein one of the at least one transparent photovoltaic device and the at least one non-transparent OLED of the energy and light producing device is laminated onto the glass pane.

5. The device of claim 1, wherein one of the at least one transparent photovoltaic device and the at least one non-transparent OLED of the energy and light producing device is disposed on the glass pane.

6. The device of claim 1, wherein the at least one transparent photovoltaic device of the energy and light producing device has a conversion efficiency greater than 10% and a transparency greater than 30% across the visible spectrum.

7. The device of claim 1, wherein the device provides greater than 10,000 lumens per $m^2$ of window area for at least one half the time the device is exposed to sunlight.

8. The device of claim 1, wherein a portion of the light emitted by the at least one non-transparent OLED of the energy and light producing device is reflected to provide indirect lighting of an environment.

9. The device of claim 1, further comprising:
at least one light emitting device (LED) or OLED disposed in a frame to output light,
wherein the controller is configured to control the operation of the at least one LED or OLED in the frame, and
wherein the energy storage device is electrically coupled to the at least one LED or OLED in the frame and is configured to power the at least one LED or OLED in the frame.

10. The device of claim 9, further comprising:
a transparent light guide disposed on the at least one LED or OLED in the frame, wherein the at least one LED or OLED in the frame outputs light to illuminate at least a portion of the transparent light guide to provide non-glare illumination.

11. A device comprising:
a window comprising a transparent or translucent glass pane;
an energy and light producing device including at least one transparent photovoltaic device disposed on a first substrate in a first area of an optical path of the glass pane of the window, and at least one non-transparent Organic Light Emitting Device (OLED) disposed on a second substrate that is disposed in a second area of the optical path of the glass pane of the window, wherein the first substrate and the second substrate are separate transparent substrates that are smaller than the glass pane, wherein the first active area of the at least one transparent photovoltaic device and the second active area of the at least one non-transparent OLED are vertically and horizontally offset from one another, and wherein the at least one non-transparent OLED outputs light;
a controller to control the operation of the at least one non-transparent OLED of the energy and light producing device; and
an energy storage device that is electrically coupled to the controller and the energy and light producing device to store energy generated by the at least one transparent photovoltaic device and to power the at least one non-transparent OLED of the energy and light producing device.

12. The device of claim 11, wherein the at least one transparent photovoltaic device and the at least one non-transparent OLED do not overlap one another.

13. The device of claim 11, wherein one of the at least one transparent photovoltaic device and the at least one non-transparent OLED of the energy and light producing device is laminated onto the glass pane.

14. The device of claim 11, wherein one of the at least one transparent photovoltaic device and the at least one non-transparent OLED of the energy and light producing device is disposed on the glass pane.

15. The device of claim 11, wherein the at least one transparent photovoltaic device of the energy and light producing device has a conversion efficiency greater than 10% and a transparency greater than 30% across the visible spectrum.

16. The device of claim 11, wherein the device provides greater than 10,000 lumens per $m^2$ of window area for at least one half the time the device is exposed to sunlight.

17. The device of claim 11, wherein a portion of the light emitted by the at least one non-transparent OLED of the energy and light producing device is reflected to provide indirect lighting of an environment.

18. The device of claim 11, further comprising:
at least one light emitting device (LED) or OLED disposed in a frame to output light,
wherein the controller is configured to control the operation of the at least one LED or OLED in the frame, and
wherein the energy storage device is electrically coupled to the at least one LED or OLED in the frame and is configured to power the at least one LED or OLED in the frame.

19. The device of claim 18, further comprising:
a transparent light guide disposed on the at least one LED or OLED in the frame, wherein the at least one LED or OLED in the frame outputs light to illuminate at least a portion of the transparent light guide to provide non-glare illumination.

20. The device of claim 1, wherein the at least one transparent photovoltaic device is a plurality of transparent photovoltaic devices, and
wherein the energy storage device that is electrically coupled to the controller and the energy and light producing device to store energy generated by the plurality of transparent photovoltaic devices.

* * * * *